United States Patent [19]
Clark et al.

[11] Patent Number: 5,592,025
[45] Date of Patent: Jan. 7, 1997

[54] PAD ARRAY SEMICONDUCTOR DEVICE

[75] Inventors: Minh-Hien N. Clark; James W. Sloan, both of Austin, Tex.

[73] Assignee: Motorola, Inc., Schaumburg, Ill.

[21] Appl. No.: 349,272

[22] Filed: Dec. 5, 1994

Related U.S. Application Data

[63] Continuation-in-part of Ser. No. 227,120, Jul. 19, 1994, Pat. No. 5,510,691, which is a continuation of Ser. No. 925,145, Aug. 6, 1992, abandoned.

[51] Int. Cl.$^6$ .......................... H01L 23/48; H01L 23/04; H01L 23/52
[52] U.S. Cl. .......................... 257/774; 257/690; 257/698; 257/734
[58] Field of Search .......................... 257/678, 680, 257/687, 690, 692, 698, 734, 774

[56] References Cited

U.S. PATENT DOCUMENTS

| | | | |
|---|---|---|---|
| 4,691,225 | 9/1987 | Murakami et al. | 357/80 |
| 4,700,473 | 10/1987 | Freyman et al. | 29/846 |
| 4,807,021 | 2/1989 | Okumura | 357/75 |
| 5,019,673 | 5/1991 | Juskey et al. | 174/52.2 |
| 5,077,633 | 12/1991 | Freyman et al. | 257/774 |
| 5,300,808 | 4/1994 | Suppelsa et al. | 257/680 |

FOREIGN PATENT DOCUMENTS

| | | |
|---|---|---|
| 57-79652 | 5/1982 | Japan . |
| 60-241244 | 11/1985 | Japan . |
| 92/11654 | 7/1992 | WIPO . |

OTHER PUBLICATIONS

"Pad Array Improves Density", Electronic Packaging & Production May 1992, pp. 25–26.

*Primary Examiner*—Carl Whitehead, Jr.
*Attorney, Agent, or Firm*—Minh-Hien Clark

[57] ABSTRACT

Pad array carriers allow greater I/O densities over conventional leaded packages by using an array arrangement for external electrical connections. A pad array carrier (48) is manufactured using a substrate (40) having metal on only one side and unplated through-holes (44). A semiconductor die (50) is mounted on and affixed to the top surface of the substrate with an electrically insulative adhesive (51). The use of the insulative adhesive allows routing of signal traces into the die mounting region directly underneath the die. Wire bonds (52) connect the die to metal traces (46) on the substrate. A package body (54) is formed on the substrate covering the die and wire bonds (52). Solder balls (56 & 58) are directly attached to the backside of the solder pads (47) by way of the through-holes.

13 Claims, 3 Drawing Sheets

PAD ARRAY SEMICONDUCTOR DEVICE

CROSS-REFERENCE TO RELATED APPLICATION

This application is a continuation-in-part of a commonly assigned U.S. Pat. application No. 08/227,120 now U.S. Pat. No. 5,510,691 James W. Sloan entitled "Low Profile Overmolded Pad Array Semiconductor Device and Method for Making the Same," filed on Jul. 19, 1994, which is a continuation of a U.S. patent application of the same inventor and title, No. 07/925,145 filed on Aug. 6, 1992, now abandoned.

FIELD OF THE INVENTION

The present invention relates to semiconductor devices in general, and more specifically to resin overmolded pad array semiconductor devices.

BACKGROUND OF THE INVENTION

Traditional dual-in-line (DIP) packages are commonly used for semiconductor devices with relatively low input/output (I/O) lead counts. However, in packaging devices with high I/O lead counts, DIPs become impractical. Furthermore, the push in the electronics industry is toward surface mount applications whereas DIPs utilize through-hole technology. The development of leadless pad array carriers has provided some advantages over conventional leaded packages, such as DIPs. These leadless pad array carriers allow greater I/O densities without undue size increases. Additionally, the leadless pad array carriers are surface mount packages which are desirable in today's applications.

The general construction of a leadless pad array carrier includes a semiconductor die mounted on an upper surface of a substrate and a plurality of solder balls attached to a lower surface of the substrate. The existing substrate is a PC board material, such as bismaleimide-triazine (BT) resin clad with copper on both upper and lower surfaces. A complicated manufacturing process is involved to produce the final substrate on which the semiconductor die is mounted. The substrate is processed in panel form and then cut into strips for device assembly.

Starting with an entire panel of copper clad PC board material, through-holes or vias and other necessary holes such as tooling holes are drilled into the panel. Then copper is plated onto the copper cladding and to the sidewalls of the through-holes, forming plated through-holes. The copper plating is achieved by using an electroless plating process followed by an electrolytic plating process. A metal patterning process is performed next, wherein the copper is etched to define the individual patterns of conductive metal traces on both upper and lower surfaces of the panel. The plated through-holes are necessary because they provide the conductive paths between the conductive metal on the upper surface of the substrate to the conductive metal on the lower surface of the substrate.

A pattern of conductive traces for an individual semiconductor die includes bonding posts, routing traces, edge traces, solder pads, and plated through-holes. The bonding posts include the portion of conductive traces that are proximal to the die mounting area and are used in the wire bonding connections between a semiconductor die and the substrate. The edge traces include the portion of the conductive traces that are distal to the die mounting area; or in other words, they are the traces that are located at the edge of the substrate. Edge traces are necessary to route all traces to ground busses located outside of package outlines. This is done to provide common connections for electroplating. Edge traces may be used for probing of assembled devices. Edge traces, however, are not necessarily exposed and may remain covered by solder resist on some devices. Solder pads include the portion of conductive traces located on the lower surface of the substrate where the traces terminate. Solder pads are used for the connection of solder balls to the substrate to provide external electrical connections to the device. Routing traces are merely those portions of the conductive traces that connect the bonding posts to the edge traces and plated through-holes as well as to the solder pads. Electrical continuity is maintained between the traces on the upper and lower surfaces of the substrate through the plated through-holes.

After the etching, a thin film of solder resist is applied over the entire surface area of both upper and lower surfaces of the panel. A resist patterning process is performed next, wherein the solder resist layer is etched away to reveal selective portions of the patterns of conductive metal traces. The portions that are revealed include die mounting areas, the bonding posts, and the edge traces, all of the above being on the upper surface of the panel. Additionally, solder pads on the bottom surface of the panel are also exposed after the patterning of the resist layer. The layer of solder resist serves several purposes. First, the resist prevents solder from running onto the traces during the solder bumping process where solder balls are attached to the solder pads on the lower surface of the substrate. Furthermore, the resist layer provides a uniform and smooth surface for the clamping of the mold die during the molding operation. The exposed portions of the patterns of conductive metal traces are subsequently plated with nickel and gold. The panel is then cut into strips which are then used in the assembly process to manufacture leadless pad array carriers.

FIG. 1 illustrates, in cross section, a completed substrate 10 for a leadless pad array semiconductor device known in the prior art. As illustrated, a PC board material substrate 12 has a pattern of conductive metal traces 14 on both upper and lower surfaces. The pattern of traces 14 has bonding posts 16, edge traces 18, and solder pads 20. Solder pads 20 are all connected to the traces 14 on the upper surface of the substrate, but those connections may not be visible in this cross section plane. Also illustrated are plated through-holes 22. Solder resist 24 is also depicted in FIG. 1, where the solder resist is located on both upper and lower surfaces of the substrate.

FIG. 2 illustrates an assembled leadless pad array carrier 30 in the prior art. As illustrated, a semiconductor die 32 is mounted onto the upper surface of the substrate 10. The die 32 is electrically connected to the bonding posts 16 with a plurality of wire 34 which are bonded to the die 32 and the wire bonding posts 16. The wire bonded semiconductor die is protected with a molded package body 36. Package body 36 is formed by a transfer molding process or a glob top process which overmolds the die 32 and wire bonds 34 with an encapsulating material. After molding, a plurality of solder balls 38 are attached to the solder pads 20 on the bottom surface of the substrate 10. In practice, devices are assembled in strip form and then singulated into individual devices after complete assembly.

One disadvantage to the above described leadless pad array carrier is the complexity of the substrate required. Because the pattern of conductive metal traces are on both the upper and lower surfaces of the substrate, the routing of the traces become complicated. Moreover, the capacitance and inductance of the device are directly proportional to the overall length of the traces. Therefore, it is desired to make the traces as short as possible, which is not always possible with complicated routing of traces. It is also desirable to make the leadless pad array carrier as thin as possible because it is targeted for use in portable equipment such as radios and pagers. Any savings in the overall height of the carrier can have significant benefits.

DETAILED DESCRIPTION OF A PREFERRED EMBODIMENT

The present invention enables a low profile and small footprint pad array semiconductor device to be manufactured using a very thin carrier substrate. The substrate needs metal traces on only its top surface, which simplifies the substrate manufacturing process. An electrically insulative die attach material allows the traces to be routed over the entire top surface of the substrate, including within the die mounting area, without creating a shorting problem, thus efficiently utilizing all available space on the substrate surface. The assembled device size can be effectively kept to a minimum with this combination.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

Figure 3:
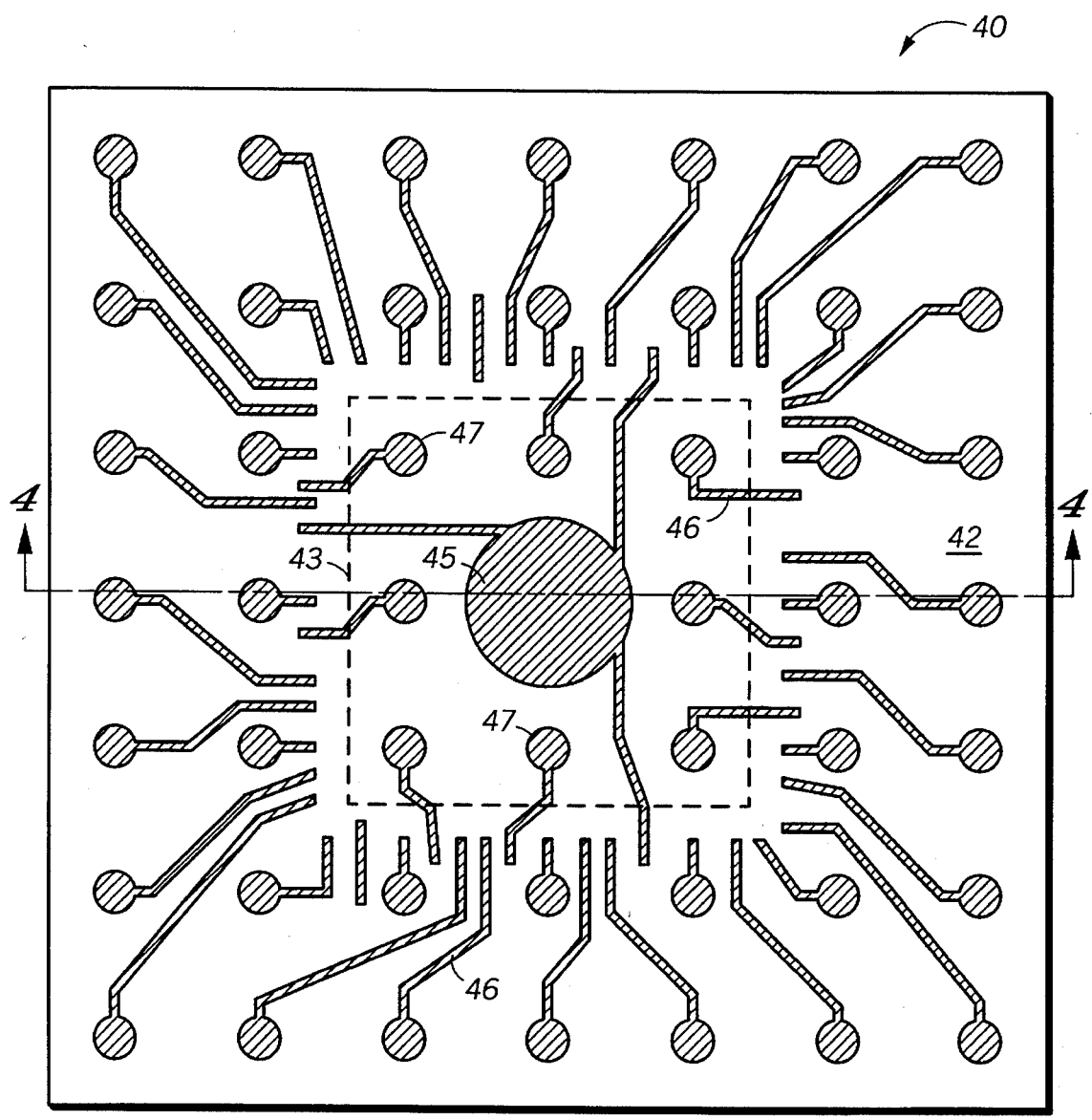
FIG. 3 illustrates, in a top view, a substrate having improved routing density for a pad array semiconductor device, in an embodiment of the present invention.

FIG. 3 illustrates, in a top view, a substrate 40 having improved routing density for a pad array semiconductor device, in accordance with the present invention. Substrate 40 is composed of a polymer carrier 42 having a pattern of conductive metal traces 46 on an upper surface of carrier 42. The conductive traces 46 is routed to take advantage of most of the available surface area on the top surface of the carrier 42 including the die mounting area 43 which is in the central region of the carrier. Additionally shown is a central metal pad 45 which has ground traces routed thereto to tie the several ground terminals of a semiconductor die (not shown in this figure) together. This metal pad will provide a direct thermal path for the die into the printed circuit board (not shown). Alternatively, the central metal pad 45 may be electrically isolated in the center of the substrate. The polymer carrier 42 can be composed of a BT resin. However, the polymer carrier is preferably polyester or polyimide reinforced with glass or kevlar fibers. These latter materials are capable of being fabricated at thicknesses less than 0.01 inches (0.25 mm). The thickness of the polymer carrier 42 can range from 0.1 mm to 0.3 mm, but is preferably 0.1 mm to 0.2 mm. In fact, since the goal is to make the device as thin as possible, it is desirable to limit the carrier to a minimum thickness. Current technology allows a minimum carrier thickness of 0.1 mm, but it is anticipated that as material technology improves, the carrier thickness can be reduced even further to yield an even lower profile device.

To provide the metal traces on the top surface of the carrier, copper cladding may be used, wherein the copper is patterned or etched to form the required conductive pattern. Cladding and etching are both known processes in the art. It is envisioned that the substrate manufacturer will be able to use existing equipment to manufacture the improved substrate of the present invention, since this substrate is simpler to make than the substrate of the prior art as metal is required on only one surface of the substrate. Thus, the present substrate should present savings in terms of material costs as well as processing costs. The metal traces may be plated after patterning with other metals such as nickel and gold for improved conductivity and wettability to solder. Traces 46 terminate in a plurality of solder pads 47. The pads 47 provide a larger contact area than the traces to allow subsequent attachment of solder balls in a later step of the assembly process. The center metal pad 45 should also be as large as possible, taking into consideration the amount of space required to route all of the other signal, power, and ground traces that the device requires. Of course, if the center metal pad 45 is also a ground pad as shown, then some spacing is required to route traces to connect to the pad so that wire bond connections (not shown) can be made between the die (not shown) and the "wire bond fingers" of the traces.

Figure 1:
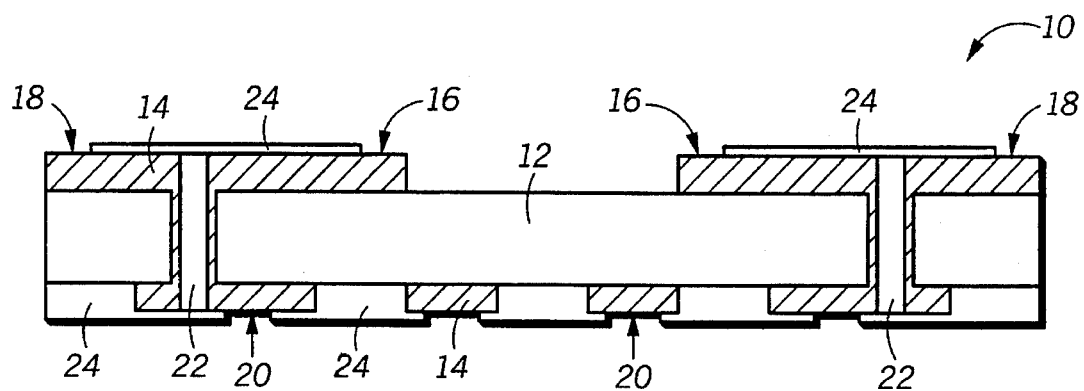
FIG. 1 illustrates, in cross section, a substrate for a pad array carrier of the prior art.
Figure 2:
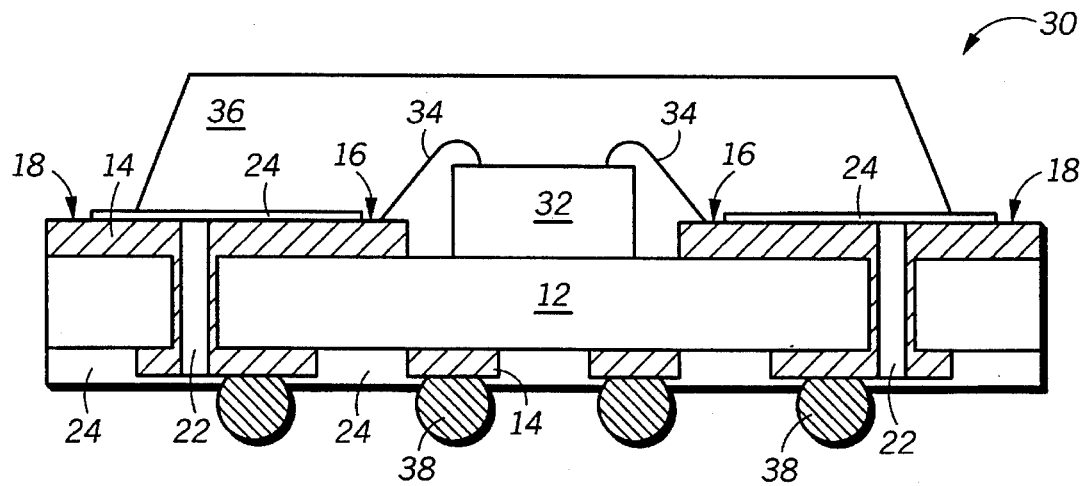
FIG. 2 illustrates, in cross section, a pad array carrier of the prior art constructed on the substrate of FIG. 1.
Figure 4:
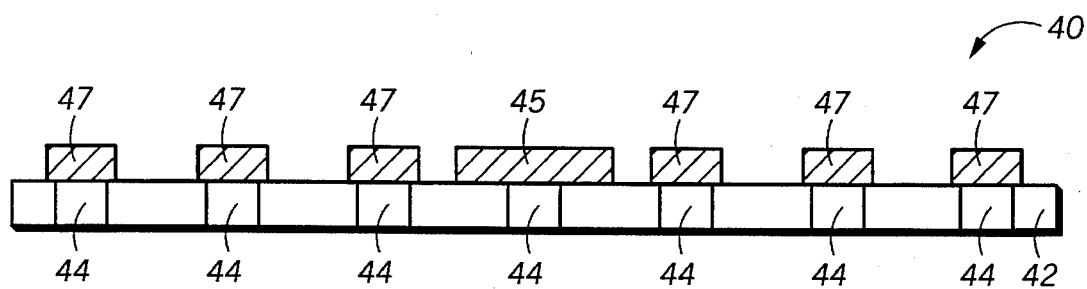
FIG. 4 illustrates, in a cross-sectional view along line 4—4, the substrate of FIG. 3.

FIG. 4 illustrates, in a cross-sectional view along line 4—4, the substrate 40 of FIG. 3. The substrate 40 has a plurality of through-holes 44 in the polymer carrier 42, wherein through-holes 44 open directly to the backside metal of the solder pads 47 illustrated in FIG. 3. In this manner, direct contact is provided to the metal on the top surface of the substrate, thus eliminating the need for metal traces on the bottom surface of the substrate. Additionally, the through-holes 44 need not be plated since they are not used for routing of multilayer metals because there is only one layer of metal. Hence, the substrate 40 can be made thinner than the substrate 10 of the prior art (as shown in FIG. 1) by using a thinner carrier material as well as eliminating one layer of metal. Furthermore, by not requiring plated through-holes, plating processing steps can be eliminated. Electroless plating can be used to further reduce plating costs and eliminate the requirement for edge traces and ground busses, whereas the prior art requires electrolytic plating with the requisite edge traces and ground busses.

Figure 5:
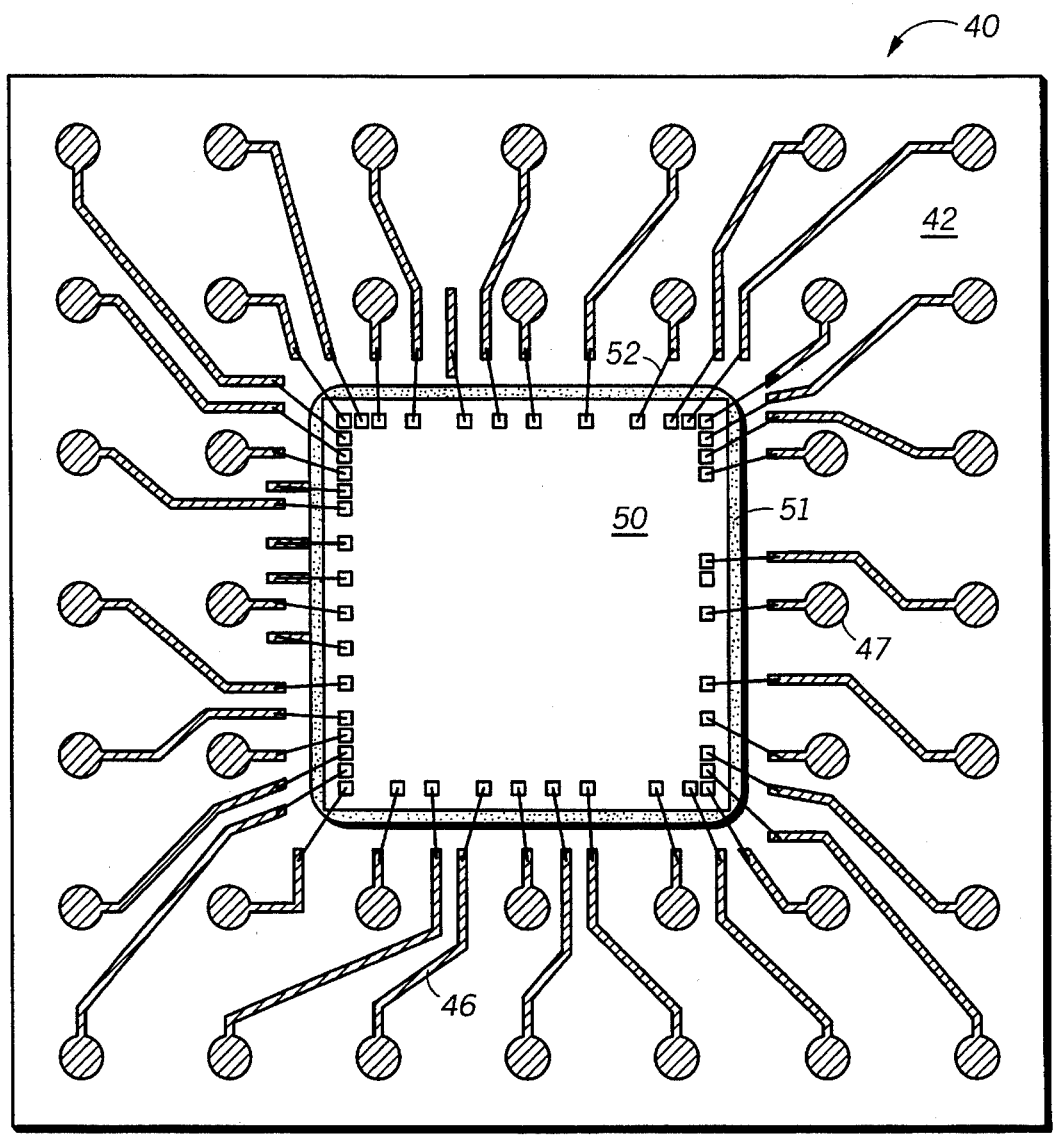
FIG. 5 illustrates, in a top view, a wire bonded semiconductor die mounted upon the substrate of FIG. 3.

FIG. 5 illustrates, in a top view, the substrate 40 of FIG. 3 having a semiconductor die 50 mounted thereon. The semiconductor die 50 is mounted and affixed to substrate 40 using an electrically insulative adhesive 51. A cross-sectional view of this mounting can be seen in FIG. 6. The adhesive 51, while being electrically insulative, is nevertheless thermally conductive. Such an adhesive can be an epoxy resin filled with aluminum oxide or alumina. An example of such a material is Ablebond 41-1™ manufactured by Ablestik. Alternatively, the adhesive may be a silicone resin filled with alumina. The fact that the adhesive is electrically nonconductive allows the traces to be routed into the central or die mounting region of the substrate without causing a shorting problem. Each trace remains electrically isolated from each other unless specifically designed otherwise. The thermal conductivity of the adhesive 51 provides a direct thermal path from the backside of the die into the substrate, including both the polymer core and the metal traces, which can then be dissipated into the board (not shown).

Figure 6:
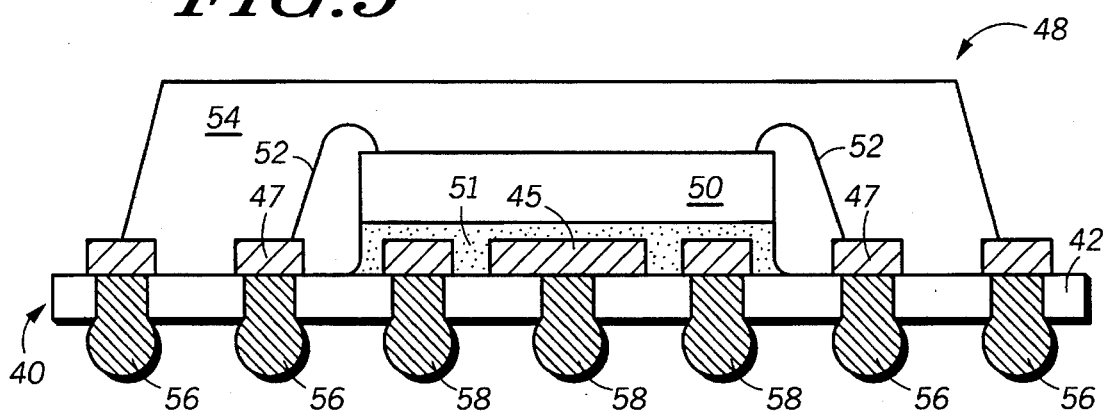
FIG. 6 illustrates, in cross section, a pad array semiconductor device using the substrate of FIG. 3, in accordance with the present invention.

FIG. 6 illustrates, in cross section, a pad array semiconductor device 48 using the substrate of FIGS. 3 and 4, in accordance with the present invention. The die 50 is electrically connected to the traces 46 with a plurality of wire bonds 52. Low profile wire bonding is preferred since it will yield a lower overall device thickness but conventional wire bonding may also be used to form the wire bonds. Both low profile and conventional wire bonding methods are known in the art. After wire bonding, a package body 54 is overmolded on the substrate by means of a transfer molding or glob top process to fully cover the die 50 and the wire bonds 52. Both transfer molding and glob top dispense are known processes to one of ordinary skill in the art. A package body thickness of 0.5 to 1.0 mm can be achieved in the case of a transfer molded body. A glob top may be thinner but will not have a uniform thickness across the device. The package body 54 can be, but is not limited to, any encapsulating material such as a polymeric resin molding compound, a silicone, or a urethane. It is desirable that the material used for package body 54 and the polymer core 42 have coefficients of thermal expansion substantially in the same range to minimize potential warpage of the molded device.

After the overmolding of the package body 54, a plurality of solder balls 56 and 58 are attached to provide external electrical connections for the die 50. Solder balls 56 and 58 are directly connected to the backside of the traces 46 by way of the through-holes 44. One advantage of directly attaching the solder balls to the backside of the conductive traces is that the routing of the traces becomes much simpler. There is no need to route the traces from the upper surface of the substrate to the lower surface of the substrate. Plus it is possible to have greater routing density by using the die mounting area. The use of an electrically insulative adhesive allows this area to be effectively used. An additional advantage is that the lengths of the conductive paths are shorter as compared to prior art devices so that the inductance and capacitance of the device are reduced. Furthermore, the center solder balls 58 provide a thermal path from the backside of the die into the board to provide good heat dissipation.

This embodiment has several other advantages over the prior art. The substrate has been simplified considerably to include metal on only one surface of the substrate. The metal patterning process is thus reduced to only metal etching one surface of the substrate which is both a time and material cost savings. Furthermore, solder resist has been completely eliminated from the substrate which also simplifies the manufacturing of the substrate. The reason that solder resist is not necessary on the lower surface of the substrate is that there is no metallization on this surface. There is no risk of solder running onto the traces and shorting the device during the solder bumping process where solder balls are attached to the traces in the through-holes. Likewise, solder resist is not necessary on the upper surface of the substrate. Since electroless plating is used, the device has no edge traces in this embodiment. Therefore, the traces do not extend to the edges of the substrate, thus allowing the mold die to clamp onto a smooth surface at the edges of the substrate. The steps of applying a layer of solder resist on both upper and lower surfaces of the substrate and then patterning the solder resist are eliminated. An added benefit to having metal on only one surface of the substrate and no solder resist is that the thickness of the substrate has been reduced. A thinner substrate translates into a thinner leadless pad array carrier which is desirable, especially in portable equipment applications such as radios and pagers.

The foregoing description and illustrations contained herein demonstrate many of the advantages associated with the present invention. In particular, it has been revealed that a pad array semiconductor can be manufactured using an improved substrate in combination with an electrically insulative adhesive. The substrate has metal on only the top surface and does not require a solder resist layer, thus simplifying the processing of the substrate which translates to a cost savings. Moreover, by eliminating metal on one side and the solder resist layers, the thickness of the substrate is reduced giving rise to a lower profile (thinner) pad array semiconductor device. Additionally, the use of an electrically insulative adhesive allows the routing density of the traces to be more efficient by utilizing all available top surface area of the substrate for the traces. Thus, the area directly underneath the die may also be used for traces and pads, such that the solder balls under the die mounting region provide actual signal connections to the die instead of being only thermal solder balls.

Thus it is apparent that there has been provided, in accordance with the invention, an overmolded semiconductor device and method for making the same that fully meet the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, patterns of conductive metal traces may vary from that illustrated, depending on the specific requirements of the semiconductor device. Furthermore, although the improved substrates do not require that the through-holes be plated, plated through-holes may also be used if needed to facilitate the attachment of the solder balls to the backside metal of the solder pads. Additionally, a layer of solder resist, from the substrate manufacturing process, may be left in place to provide a smooth clamping surface for the mold die in the transfer molding process. Therefore, it is intended that this invention encompass all such variations and modifications falling within the scope of the appended claims.

We claim:

1. A pad array semiconductor device comprising:

a substrate having a die mounting region on a first surface, a second surface, and a plurality of through-holes, only the first surface having a pattern of conductive metal traces which includes a plurality of solder pads overlying the plurality of through-holes, wherein the plurality of solder pads is larger in diameter than the plurality of through-holes;

a semiconductor die mounted on and directly affixed to the first surface of the substrate in the die mounting region with an electrically insulative adhesive;

a plurality of wire bonds electrically connecting the semiconductor die to the pattern of conductive metal traces;

a package body formed by an encapsulating material covering the semiconductor die and the plurality of wire bonds; and a plurality of solder balls directly attached to the plurality of solder pads through the plurality of through-holes.

2. The semiconductor device of claim 1, wherein the encapsulating material forming the package body is a polymeric molding compound.

3. The semiconductor device of claim 1, wherein the pattern of conductive metal traces extend into the die mounting region, wherein a portion of the metal traces in the die mounting region comprises signal traces.

4. The semiconductor device of claim 1, wherein the substrate is composed of a material selected from a group consisting of:

polyester reinforced with glass fibers and polyimide reinforced with glass fibers.

5. The semiconductor device of claim 4, wherein the substrate has a thickness substantially in a range of 0.1 millimeter to 0.2 millimeter.

6. The semiconductor device of claim 1, wherein the electrically insulative adhesive is an epoxy resin filled with aluminum oxide.

7. The semiconductor device of claim 1, wherein the substrate has a first coefficient of thermal expansion and the encapsulating material has a second coefficient of thermal expansion, the first and second coefficients of thermal expansion being substantially in a same range.

8. A semiconductor device comprising:

a substrate having a die mounting region on a first surface, a second surface, and a plurality of unplated through-holes, only the first surface having a pattern of conductive metal traces which includes a plurality of solder pads overlying the plurality of through-holes, wherein the plurality of solder pads is larger in diameter than the plurality of through-holes, the substrate having a thickness substantially in a range of 0.1 millimeter to 0.2 millimeter;

a semiconductor die mounted on and directly affixed to the first surface of the substrate in the die mounting region with an electrically insulative adhesive;

a plurality of wire bonds electrically connecting the semiconductor die to the pattern of conductive metal traces;

a package body formed by an encapsulating material covering the semiconductor die and the plurality of wire bonds; and a plurality of solder balls directly attached to the plurality of solder pads through the plurality of through-holes.

9. The semiconductor device of claim 8, wherein the package body is either a molded package body or a glob top.

10. The semiconductor device of claim 8, wherein the pattern of conductive metal traces extend into the die mounting region, wherein a portion of the metal traces in the die mounting region comprises signal traces and a central ground pad.

11. The semiconductor device of claim 8, wherein the substrate is composed of a material selected from a group consisting of:

polyester reinforced with glass fibers and polyimide reinforced with glass fibers.

12. The semiconductor device of claim 8, wherein the electrically insulative adhesive is an epoxy resin filled with aluminum oxide.

13. The semiconductor device of claim 8, wherein the substrate has a first coefficient of thermal expansion and the encapsulating material has a second coefficient of thermal expansion, the first and second coefficients of thermal expansion being substantially in a same range.

* * * * *